(12) United States Patent
Rauscher (10) Patent No.: US 6,636,128 B2
(45) Date of Patent: Oct. 21, 2003

(54) FREQUENCY-TUNABLE NOTCH FILTER

(75) Inventor: Christen Rauscher, Alexandria, VA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 09/874,429

(22) Filed: Jun. 7, 2001

(65) Prior Publication Data

US 2003/0169128 A1 Sep. 11, 2003

(51) Int. Cl.[7] ................................................. H03H 7/01
(52) U.S. Cl. .......................... 333/175; 333/174; 333/202
(58) Field of Search ............................... 333/176, 202, 333/175, 174, 177, 109, 132, 134

(56) References Cited

U.S. PATENT DOCUMENTS

| | | | |
|---|---|---|---|
| 3,355,668 A | 11/1967 | Boensel et al. | |
| 3,532,908 A | 10/1970 | Jennings | |
| 3,794,938 A | * 2/1974 | Boelter | 333/168 |
| 3,895,304 A | 7/1975 | Klein | |
| 4,091,236 A | 5/1978 | Chen | |
| 4,195,265 A | 3/1980 | Vali | |
| 4,417,220 A | 11/1983 | Holyman et al. | |
| 4,496,859 A | 1/1985 | Crooks | |
| 4,662,001 A | 4/1987 | Cruz et al. | |
| 4,679,001 A | 7/1987 | West | |
| 4,731,587 A | 3/1988 | Jensen | |
| 4,939,473 A | 7/1990 | Eno | |
| 5,021,756 A | * 6/1991 | Tajima et al. | 333/132 |
| 5,054,117 A | 10/1991 | Cruz et al. | |
| 5,065,453 A | 11/1991 | Thomas | |
| 5,325,204 A | 6/1994 | Scarpa | |
| 5,331,299 A | 7/1994 | Smith | |
| 5,337,056 A | 8/1994 | Dax | |
| 5,339,057 A | * 8/1994 | Rauscher | 333/166 |
| 5,400,084 A | 3/1995 | Scarpa | |
| 5,438,572 A | * 8/1995 | Rauscher | 370/123 |
| 5,451,915 A | 9/1995 | Katzin et al. | |
| 5,838,675 A | * 11/1998 | Rauscher | 370/343 |
| 5,917,387 A | * 6/1999 | Rice et al. | 333/174 |
| 6,020,783 A | 2/2000 | Coppola | |
| 6,097,269 A | 8/2000 | Hernandez | |
| 6,107,898 A | * 8/2000 | Rauscher | 333/175 |
| 6,115,368 A | 9/2000 | Schilling | |
| 6,202,783 B1 | 3/2001 | Taylor et al. | |

* cited by examiner

Primary Examiner—Robert Pascal
Assistant Examiner—Dean Takaoka
(74) Attorney, Agent, or Firm—L. George Legg; John J. Karasek (57) ABSTRACT

A new type of frequency-tunable active notch filter achieves frequency selectivity through interaction among input derived signal components that are passed through parallel signal channels in a forward-only direction. The notch filter differs from earlier channelized notch filters by using multiple, instead of just one, bandpass channels that maintain required forward signal flow in the main, passband-determining signal path without signal distortion at passband frequencies. The new approach has been experimentally verified with a hybrid-integrated three-channel filter whose 40-dB-deep band-reject notch can be continuously tuned, with the help of voltage-controlled variable-capacitance elements, from 9.5 to 10.5 GHz. A single-pole bandpass filter tunes in frequency with the help of only one variable capacitance element, yet still maintains constant passband width across the tuning span. One feature of the bandpass filter is the achievement of constant notch bandwidth across the entire frequency-tuning span of the notch filter.

18 Claims, 6 Drawing Sheets

FREQUENCY-TUNABLE NOTCH FILTER

BACKGROUND OF THE INVENTION

1. Field of the Invention

The present invention relates to the field of active notch filters. More particularly, the present invention relates to a channelized frequency-tunable active notch filter with a low-distortion passband response.

2. Description of the Prior Art

In modern broadband system applications, where receivers are especially vulnerable to signal interference, care must be taken to suppress incidental, unwanted signals that can degrade receiver performance through the generation of nonlinearity-induced spurious signals. A conventional broadband power limiter, often implemented with semiconductor p-i-n diodes, can provide effective protection against receiver front-end burnout, but will cause spurious responses of its own, due to the nonlinear action of the limiting process. An alternative is to place a notch band-reject filter in front of a receiver's low-noise amplifier to notch out potential interference, with frequency-tunability added to permit adaptation to changing incidental signal conditions. This type of filter will subsequently be referred to as a tunable notch filter, for short. Because of the strategic up-front position of the filter, it is essential that the passband-determining portions of the circuit be as free as possible of losses and nonlinearities to minimize noise contributions and signal distortion, respectively. Although active filters have the ability to provide good frequency selectivity, as well as reduce circuit size, weight, and cost, which are the critical requirements in modern, multifunction, wide-bandwidth system applications, they can be at a disadvantage when it comes to noise, susceptibility to signal distortion, and signal-level dependence of transfer characteristics.

A common way to realize an active notch filter is to augment a passive notch filter structure with active loss-compensation circuitry that involves regenerative feedback, yielding overall designs that display good frequency selectivity, yet are small in size. Among the particular disadvantages of this approach are high noise levels, and the potential for parasitic oscillations, should the active element gain change with temperature or age.

Active notch filters, in the past, have exhibited very high noise figures and high signal distortion levels, even at passband frequencies where no filtering action takes place. This is due to the presence of impedance matching networks in the main signal path that introduce noise, and the presence of active circuit elements in the form of transistors and amplifiers that contribute both noise and signal distortion.

An attractive alternative, which does not harbor the potential for parasitic circuit instabilities and possesses other distinguishing attributes, is to employ a channelized configuration that relies on interaction among channel feed-forward signal components to generate a sharp rejection notch, as described in U.S. Pat. No. 5,339,057 to Rauscher and an article entitled "Microwave Channelized Active Filters—A New Modular Approach to Achieving Compactness and High Selectivity" authored by Rauscher in the IEEE Microwave Theory Tech. Transactions, vol. 44, pp. 122–132, Jan. 1996.

Figure 1:
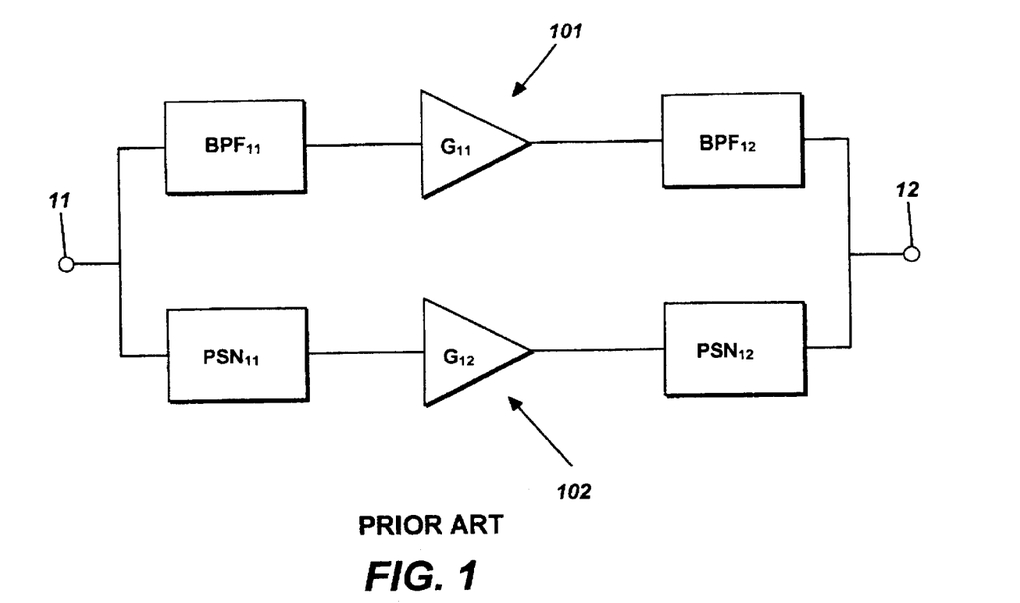
FIG. 1 is a schematic block diagram of a prior-art two-channel active notch filter.

The simplest implementation of a channelized notch filter encompasses two parallel-connected channels, comprising one frequency-selective channel with a narrow bandpass response, and one bypass channel with an associated phase response that establishes a direct signal path from the filter input to output. A representative example of such a filter, in block-diagram form, is shown in FIG. 1. The frequency-selective channel, with its left-hand-side and right-hand-side bandpass filters BPF11 and BPF12, invariably requires a unilateral amplifier, G11, to compensate for passive-circuit losses as well as to direct signal flow. The bypass channel, whose main purpose is to provide phase shift with the help of left-hand-side and right-hand-side phase-shift networks PSN11 and PSN12, on the other hand, often requires another unilateral amplifier G12 solely to assure feed-forward signal propagation in the channel, as associated passive-circuit dissipation losses are generally low, due to the simplicity and the non-resonant nature of the structures typically involved. With the composite notch filter's passband response determined primarily by the characteristics of the bypass channel, any amplifier used therein is apt to be a prominent source of passband noise and distortion.

In the bypass channel of a two-branch channelized notch filter, the use of a unilateral gain block or amplifier is unavoidable, due to stability and other considerations.

Therefore, it is an objective of certain embodiments of the present invention to provide a circuit architecture that preserves the unilateral characteristics of the bypass channel without requiring the actual presence of a gain block or amplifier in that channel.

It is another objective of certain embodiments of the present invention to provide a frequency-tuned active notch filter, which adopts a circuit architecture in which the passband determining parts of the filter are essentially free of noise- and distortion-generating active circuit elements, and also largely free of lossy impedance-matching networks that can add to passband noise.

It is still another objective of certain embodiments of the present invention to provide a single-pole bandpass filter that can accomplish frequency tuning using only one variable capacitance element, yet still maintains constant passband width across the tuning span.

Therefore, it is still a further objective of certain embodiments of the present invention to provide a notch filter that combines the low-distortion qualities of passive notch filters with the performance, size, weight, and cost qualities of active notch filters.

SUMMARY OF THE INVENTION

In a first aspect, the present invention relates to a tunable notch filter which comprises a frequency-selective four-port directional coupling network and a reciprocal, passive phase-shift network. Upon receiving an input signal within a predetermined frequency band, the frequency-selective four-port directional coupling network directs a part of the input signal received at the notch filter input port to the reciprocal, passive phase-shift network before directing it further to the filter output port. The coupling network directs the other part of the input signal directly to the output port of the notch filter. The part of the signal passing through the phase-shift network and the part of the signal passing directly to the filter output port may cancel each other at the filter output port. Therefore, the input signal within the predetermined band is filtered out by the notch filter. Upon receiving an input signal outside the predetermined frequency band, the frequency-selective four-port directional coupling network directs the entire input signal to the reciprocal, passive phase-shift network before directing it further to the output port of the notch filter. Therefore, the input signal outside the predetermined band propagates substantially unperturbed from the filter's input port through the reciprocal phase-shift network to filter's output port.

In a second aspect, the present invention relates to a channelized notch filter which comprises three parallel channels. The first channel comprises a first bandpass filter, a first phase-shift network, and a second bandpass filter. The second channel includes a third bandpass filter. The first and the second channels may be interchanged. The third channel includes a second phase-shift network. The input ports of the three channels are all electrically connected to the input port of the notch filter. The output port of the notch filter is connected to the output port of either the first channel or the second channel. The output ports of the first and the second channels are electrically connected to one another through a third phase-shift network. The output port of the third channel is directly connected to the output port of one of the other two channels, which is not connected directly with the filter output port.

The notch filter of the present invention offers, for the first time, a microwave active notch filter approach that significantly reduces passband noise, when compared to earlier techniques, and virtually eliminates filter-generated passband signal distortion. The notch filter of the present invention may still possess most of the desirable characteristics of a microwave active notch filter with regard to combining good frequency selectivity with small size and weight, and low potential cost. In addition, the notch filter of the present invention may retain most of the desirable attributes of prior-art channelized active notch filters, including unconditional circuit stability, modular circuit assemblies, and exceptionally high tolerance for passive-element dissipation losses, thereby permitting the use of compact, but lossy lumped circuit elements within the context of a planar microwave-monolithic-integrated-circuit format.

In a third aspect, the present invention relates to a bandpass filter that tunes in frequency by tuning only one element with a variable or tunable reactance, yet still maintains a constant passband width across the tuning span. An important feature of the bandpass filter of the present invention is that it permits the achievement of constant notch bandwidth across the entire frequency-tuning span of a notch filter in which the bandpass filter is incorporated as a component. The solution demonstrated here involves bandpass filters with capacitively end-coupled resonators, where each resonator is split in half at the electrical symmetry point. This provides optimum impedance-transformation properties that render the bandpass channel's passband width, and hence the notch filter's notch bandwidth, largely invariant to tuning frequency.

DETAILED DESCRIPTION OF THE PREFERRED EMBODIMENTS

In a first aspect, the present invention relates to a tunable notch filter which comprises a frequency-selective four-port directional coupling network and a reciprocal, passive phase-shift network. The reciprocal passive phase-shift network, which is connected between two ports of the frequency-selective four-port directional coupling network and serves as bypass channel for the filter, does not contain an amplifier. Therefore, both the interfering parasitic signals and the signal distortion caused by an amplifier in the bypass channel may be minimized by this design.

Figure 2:
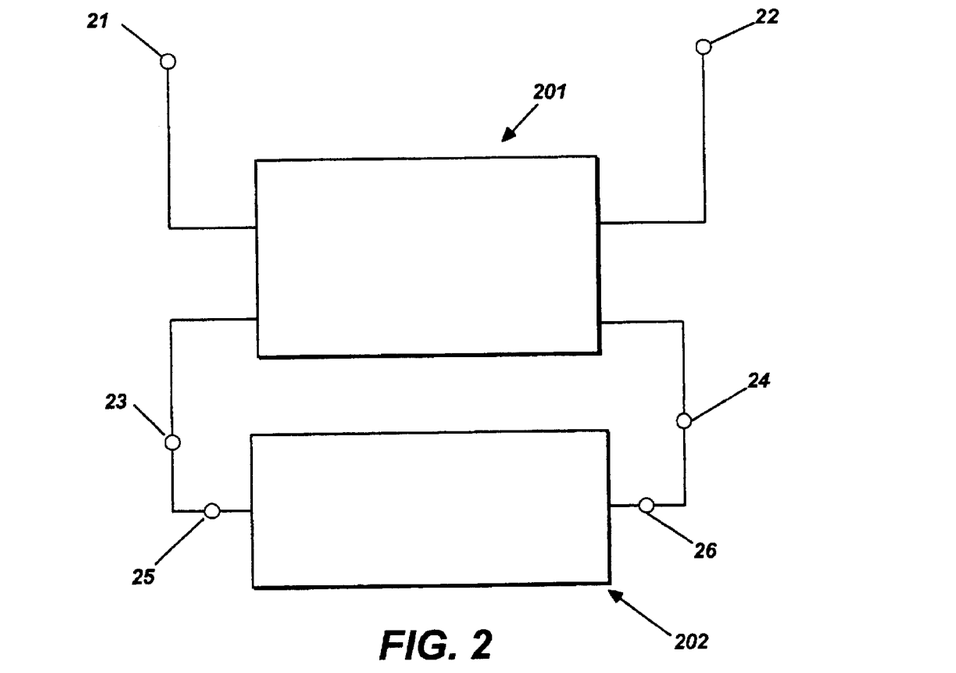
FIG. 2 is a schematic block diagram of a channelized notch filter according to the present invention.

FIG. 2 illustrates a schematic block diagram of a tunable notch filter of the present invention. Block 201 is a frequency-selective four-port directional coupling network, which has ports 21, 22, 23 and 24. Block 202 is a reciprocal passive phase-shift network, which has two ports 25 and 26. All the ports serve as the electrical connecting points. Ports 21–22 serve as the input port 21 and the output port 22 respectively, for the tunable notch filter. Port 23 is electrically connected to port 25, and port 24 is electrically connected to port 26. One task of the directional coupling network is to allow signals entering at port 21 to proceed largely uninhibited to port 23 and to allow signals entering at port 24 to proceed largely uninhibited to port 22 when the signals are outside of a predetermined frequency range.

Upon receiving an input signal within the predetermined frequency band at input port 21, the frequency-selective four-port directional coupling network 201 directs a portion of the input signal directly to output port 22. The frequency-selective four-port directional coupling network 201 directs the remainder of the input signal to port 23. Generally, none of the input signal is directed by the frequency-selective four-port directional coupling network 201 to port 24. The remainder of the input signal passes through port 23, port 25 and the reciprocal passive phase-shift network to port 26. Thereafter, this signal passes through port 26, port 24 and back into the frequency-selective four-port directional coupling network 201, which directs the remainder of the signal to the output port 22. The remainder of the signal passing through the reciprocal passive phase-shift network 202 and the portion of the input signal being directed to output port 22 by the frequency-selective four-port directional coupling network 201 are made to be of equal amplitude and 180 degrees out-of-phase and cancel each other at output port 22. This is accomplished by making the appropriate choices for the phase-response attributes of the phase-shift network 202 and the amplitude and phase properties of the four-port coupling network 201.

Upon receiving an input signal outside the predetermined frequency band at the input port 21, the frequency-selective four-port directional coupling network 201 directs the entire input signal to port 23. The entire input signal passes through port 23, port 25, the reciprocal passive phase-shift network 202, port 26, port 24 and finally to output port 22. The entire input signal, which has a frequency outside the predetermined frequency band, passes through the tunable notch filter largely uninhibited.

Figure 3:
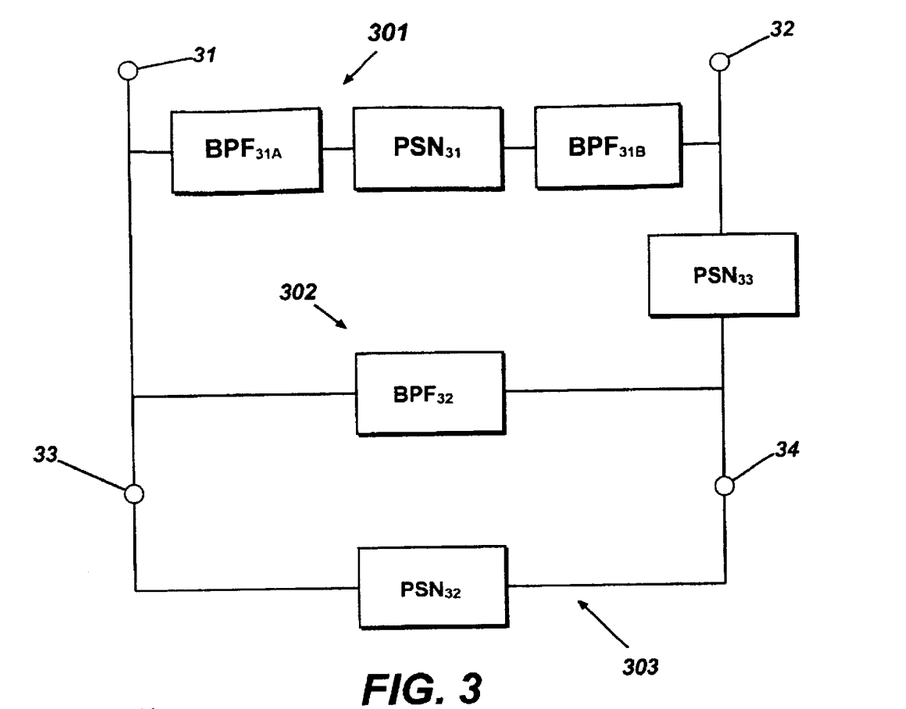
FIG. 3 is a schematic block diagram of a new three-channel notch filter according to the present invention.

One embodiment of the notch filter of the present invention is illustrated in FIG. 3. The filter includes three branch channels: branch channel 301, branch channel 302 and branch channel 303. Channel 301 and channel 302 are frequency-selective bandpass channels. Channel 303 is a direct bypass channel. Channel 301 includes a bandpass filter BPF31A, a phase-shift network PSN31 and another bandpass filter BPF31B connected in cascade. Channel 302 includes a bandpass filter BPF32. Channel 303 includes a phase-shift network PSN32.

The input port of channel 301, input port 31, the input port of channel 302 and the input port of channel 303 are electrically connected together. The output port of channel 301 and output port 32 are electrically connected together. The output port of channel 301 and the output port of channel 302 are connected through another phase-shift network PSN33. The output port of channel 302 and the output port of channel 303 are electrically connected to one another.

Preferably a first amplifier can be inserted in channel 301 between bandpass filters BPF31A and BPF31B. Preferably, a second amplifier can be included in channel 302 by splitting bandpass filter BPF32 into two segments and inserting the second amplifier between them.

Preferably, the channels 301, and 302 are rendered electrically equivalent, with the sole exception of the frequency-selective channel's phase-shift network PSN31, whose transmission parameters are chosen to provide an approximate 180-degree transmission phase differential between the two bandpass channels at output port 32. Alternatively, the contents of channels 301 and 302 could be interchanged without compromising performance.

Preferably, some of the electric components of the notch filter are made from a highly conductive or substantially superconducting material. The highly conductive material is a material with minimal resistivity such as silver, copper or aluminum.

Figure 4:
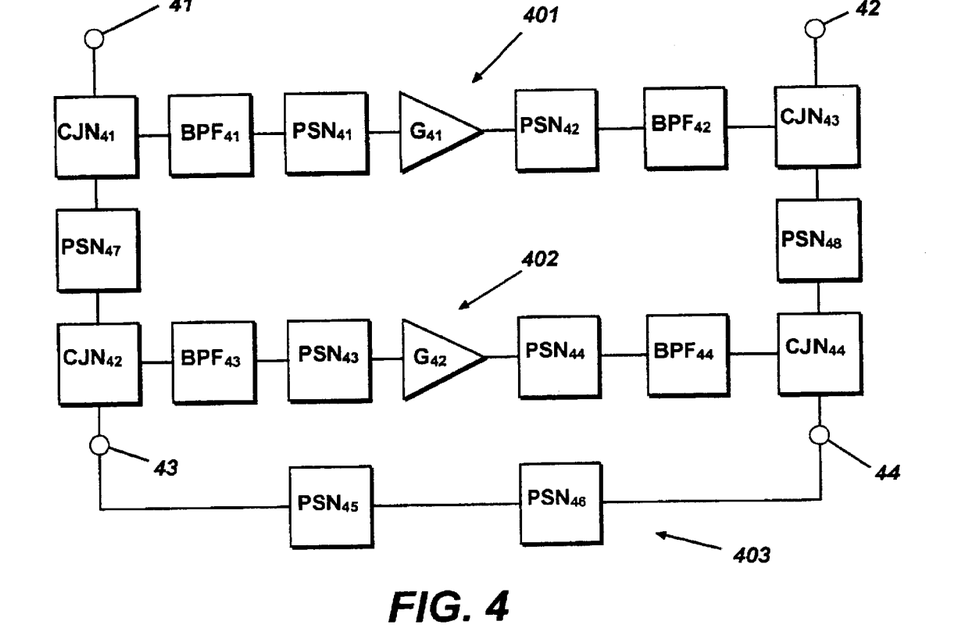
FIG. 4 is a schematic block diagram of another new three-channel notch filter according to the present invention.

A more preferred embodiment of the notch filter of the present invention is illustrated in FIG. 4 of the drawings. The notch filter as illustrated in FIG. 4 includes three branch channels: branch channel 401, branch channel 402 and branch channel 403. Channel 401 and channel 402 are frequency-selective bandpass channels. Channel 403 is a direct bypass channel. Channel 401 includes a bandpass filter BPF41, a phase-shift network PSN41, an amplifier G41, a phase-shift network PSN42, and a bandpass filter BPF42, all connected sequentially in cascade. Channel 402 includes a bandpass filter BPF43, a phase-shift network PSN43, an amplifier G42, a phase-shift network PSN44, and a bandpass filter BPF44 all connected sequentially in cascade. Channel 403 includes a phase-shift network PSN45 and a phase-shift network PSN46 all connected sequentially in cascade.

A first three-port compensated junction network CJN41 is connected to a first port of channel 401, input port 41 and phase-shift network PSN47. A second three-port compensated junction network CJN42 is connected to a first port of channel 402, phase-shift network PSN47, and a first port of channel 403. A third three-port compensated junction network CJN43 is connected to a second port of channel 401, output port 42 and phase-shift network PSN48. A fourth three-port compensated junction network CJN44 is connected to a second port of channel 402, phase-shift network PSN48 and a second port of channel 403.

Generally, all the connections mentioned in the present invention are electrically connected. Preferably all the connections in the present invention are connected through suitable types of transmission lines with suitable lengths. The choice of length and type of a transmission line which is suitable for the notch filter of the present invention is well known to a person skilled in the art.

The two bandpass channels 401 and 402, phase-shift networks PSN47 and PSN48, together with compensated junction networks CJN41, CJN42, CJN43, and CJN44 that link, respectively, the ports of the bandpass channels and the input and output ports of the notch filter, form a nonreciprocal, active-circuit rendition of a four-port directional bandpass filter. No signals are injected backward into the bypass channel 403, save for reflections stemming from junction discontinuities, and residuals introduced by practical limits on achievable directivity of the four-port assembly. Ports 41, 42, 43 and 44 are the four ports of the frequency-selective directional coupling network. As in the classic case, the two bandpass channels are assigned identical amplitude responses. Pertinent transmission-line lengths and phase-shift networks are chosen so that the signals transmitted through the two bandpass channels add in-phase at the notch filter output port 42, but cancel each other in the opposite-flow direction to eliminate the back flow of the signals in the four-port frequency-selective directional coupling network.

Due to the above-discussed attributes of the four-port directional bandpass filter assembly, substantially no signals are injected backward into the bypass channel 403. Using well-known passive circuit techniques to reduce parasitic signal components to below-significant levels, an amplifier is no longer needed to ensure forward signal flow in the bypass channel, allowing the bypass channel to be implemented as a passive, reciprocal all-pass network. Optionally, this network may merely consist of a uniform transmission line. Signals outside of the predetermined frequency band (also called the notch filter passband frequencies), as a result, can propagate largely unperturbed from the filter's input port to its output port via the bypass channel 403 and phase-shift networks PSN47 and PSN48. Noise and signal-distortion levels of the notch filter of the present invention at frequencies away from the predetermined frequency band thus are essentially determined by the properties of bypass channel 403 and phase-shift networks PSN47 and PSN48, which tend to cause a minimal disturbance to the input signals.

Preferably, the channels 401 and 402 are rendered electrically equivalent, with the exception of the frequency-selective channel's phase-shift networks, PSN41, PSN42, PSN43 and PSN44, whose transmission parameters are chosen to provide an approximate 180-degree transmission phase differential between the two bandpass channels at the notch filter output port. Optionally, phase-shift networks PSN45 and PSN46 can be combined into one phase-shift network to serve the same function of the two phase-shift networks.

Preferably, one embodiment of the bandpass filter used in the present invention incorporates variable reactance elements. More preferably, the variable reactance element includes a variable capacitance element. Most preferably the variable reactance element includes a voltage-tuning varactor diode or an array of discretely switchable fixed-value capacitors.

The notch bandwidth is defined in the current context as the notch bandwidth at the 10-dB-down points. The "predetermined frequency band" described in the present invention is also called "notch band" or "notch" for simplicity. In one preferred embodiment of the present invention, the predetermined frequency band is preferably a frequency band centered between 9.5 and 10.5 GHz with a bandwidth less than 200 MHz. More preferably, the bandwidth is less than 100 MHz. Other frequency bands and bandwidths are also possible and are within the scope of the invention. A skilled person can adjust the center and the bandwidth of the predetermined frequency band by varying the circuit components involved.

The phase-shift networks, and compensated junction networks used in the present invention are well known to persons skilled in the art.

In one preferred embodiment of the present invention, the notch filter of the present invention has a passband spanning 6 to 14 GHz excluding the notch. If other types of circuit components are employed, suitable passbands can be selected by a skilled person.

Normally a well-known generic bandpass filter can be used in the notch filter of the present invention. Preferably a single-pole bandpass filter, whose notch center frequency can be tuned by tuning only one variable reactance element yet still maintains constant passband width across the tuning span, is used in the notch filter of the present invention.

Figure 5A:
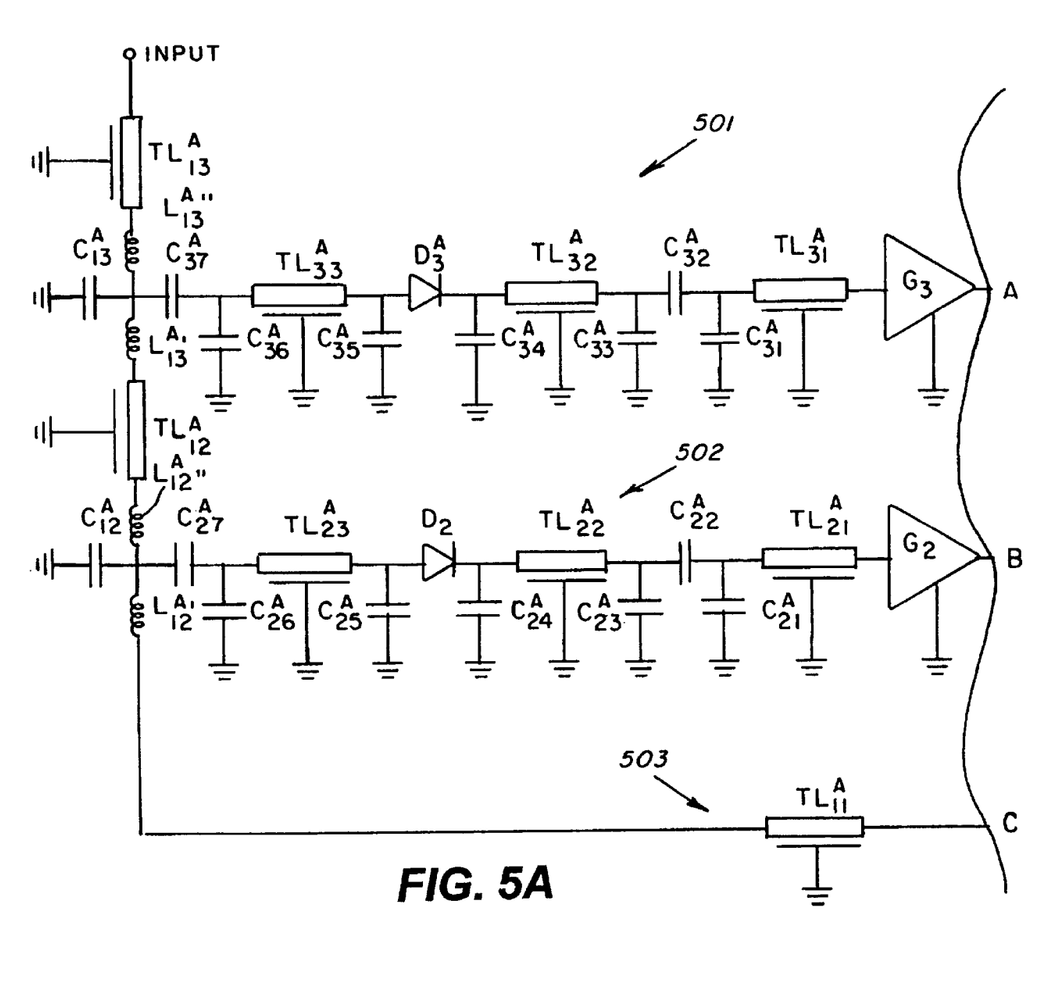
FIG. 5A is the left portion of a simplified equivalent circuit diagram of a preferred embodiment of a notch filter of the present invention.
Figure 5B:
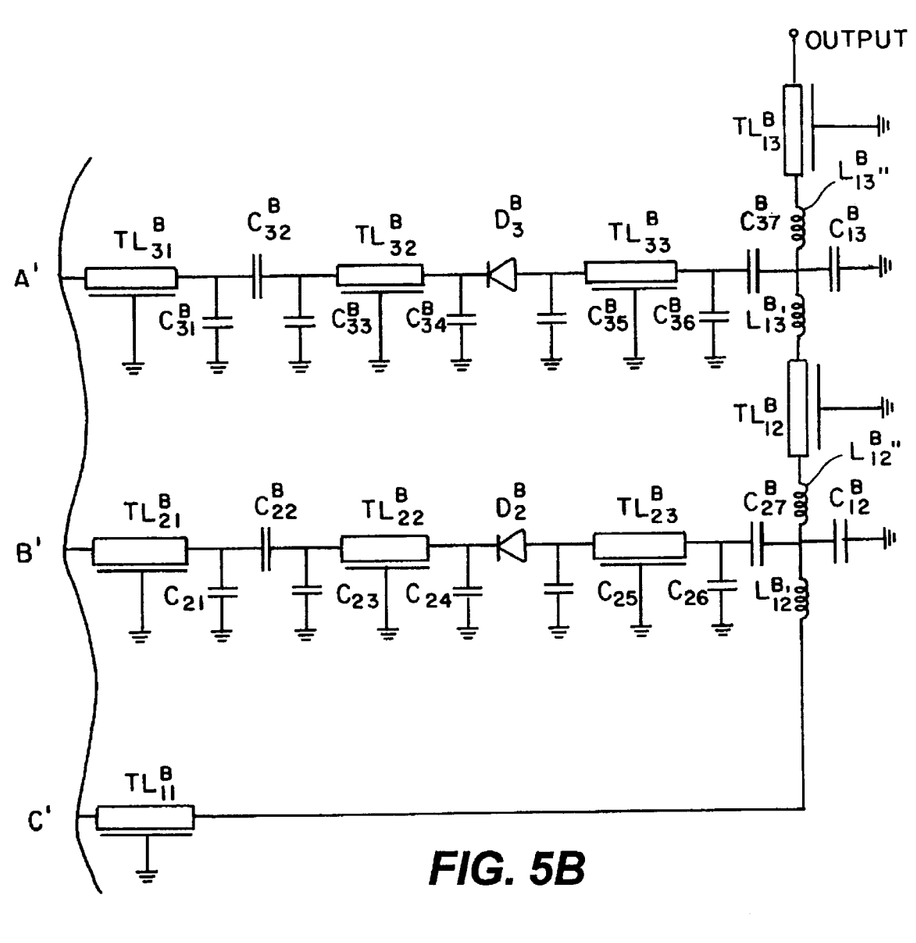
FIG. 5B is the right portion of a simplified equivalent circuit diagram of a preferred embodiment of a notch filter of the present invention.

In a more preferred embodiment, a channelized three-branch notch filter of the present invention is designed and implemented as a hybrid-integrated circuit, providing continuous variability of the notch center frequency between arbitrarily selected 9.5 and 10.5 GHz frequency points. A diagram of such a circuit is shown in FIGS. 5A and 5B. FIG. 5A shows the left half of the circuit diagram and FIG. 5B shows the right half of the circuit diagram. Points A, B and C in FIG. 5A connect to points A', B', C' in FIG. 5B to complete the entire circuit diagram.

The notch filter shown in FIGS. 5A and 5B is based on the block diagram illustrated in FIG. 4. The notch filter has one input port and one output port. The input port has two terminals 511 and 512. The output port has two terminals 513 and 514. Terminals 512 and 514 are grounded. The four bandpass filters indicated in FIG. 4 are each realized in FIGS. 5A and 5B as a single, capacitively-end-coupled-resonator filters. These bandpass filters may be implemented, together with all other passive-circuit structures, as planar gold microstrip structures on 0.010-inch-thick alumina substrates with gold ground planes or on other suitable substrates of other thicknesses and other materials, such as ceramics, semiconductor, plastics and single-crystal materials. As can be readily seen, the circuit, as far as the passive-element structures are concerned, is fully symmetric. This choice was made for reasons of topological convenience, and is not a condition for applying this invention. Consequently, in this particular interpretation of FIG. 4, BPF41 and BPF42 are electrically identical. By the same token, BPF43 and BPF44 are electrically identical; PSN41 and PSN42 are electrically identical; PSN43 and PSN44 are electrically identical. Furthermore, the frequency-selective channels 401 and 402 are rendered electrically equivalent, with the sole exception of the frequency-selective channels' four phase-shift networks, PSN41, PSN43 and PSN42, PSN44, whose transmission parameters are chosen to provide approximately an 180-degree transmission phase differential between the bandpass channels, when operating in conjunction with phase-shift networks PSN47 and PSN48.

With reference to the equivalent circuit of FIGS. 5A and 5B, each bandpass filter block of FIG. 4 (BPF41, BPF42, BPF43 and BPF44), is realized as a pair of inductive, high-impedance uniform transmission line segments of equal electrical length (represented by respective transmission line element pairs $TL^A_{22}$ and $TL^A_{23}$; $TL^B_{22}$ and $TL^B_{23}$; $TL^A_{32}$ and $TL^A_{33}$; and $TL^B_{32}$ and $TL^B_{33}$), with the transmission line segments within each pair linked through a series connected commercial MA-46604 abrupt-junction semiconductor tuning varactor diode in chip form (represented by elements $D^A_2$, $D^B_2$, $D^A_3$, and $D^B_3$, respectively), and cascade-connected at their other (outside) ports to interdigitated series coupling capacitors which are augmented by shunt capacitors to ground. The shunt capacitors may provide impedance-transformation. The added shunt capacitance is realized in the circuit by enlarging the terminal pad areas of the microstrip interdigitated series capacitors. Where the filters connect to the direct signal path at respective three-way junctions, pertinent shunt capacitors are shared between the respective filter section and its junction network. Each series-shunt-capacitor combination is described in the equivalent circuit of FIGS. 5A and 5B by a group of three capacitors (represented by $C^A_{21}$, $C^A_{22}$, and $C^A_{23}$; $C^A_{26}$, $C^A_{27}$, and $C^A_{12}$; $C^A_{31}$, $C^A_{32}$, and $C^A_{33}$; $C^A_{36}$, $C^A_{37}$, and $C^A_{13}$; and their symmetrically arranged, B-superscripted counterparts represented by $C^B_{21}$, $C^B_{22}$, and $C^B_{23}$; $C^B_{26}$, $C^B_{27}$, and $C^B_{12}$; $C^B_{31}$, $C^B_{32}$, and $C^B_{33}$; $C^B_{36}$, $C^B_{37}$, and $C^B_{13}$ contained in the right hand portion of the equivalent circuit in FIGS. 5A and 5B). The remaining shunt capacitors in FIGS. 5A and 5B, namely those connected at the diode terminals, describe the capacitance to ground of the diode-chip mounting pads (represented by capacitors $C^A_{24}$, $C^A_{25}$, $C^A_{34}$, and $C^A_{35}$, and their symmetrically arranged, B-superscripted counterparts represented by capacitors $C^B_{24}$, $C^B_{25}$, $C^B_{34}$, and $C^B_{35}$ contained in the right-hand portion of the equivalent circuit). The compensated junction networks shown in FIG. 4 (CJN41, CJN42, CJN43, and CJN44) are implemented by augmenting the shunt capacitors shared with the bandpass filters at the junctions, ($C^A_{12}$, $C^B_{12}$, $C^A_{13}$, and $C^B_{13}$), each with two series connected small inductors in the direct signal channel (represented by $L^A_{12}{}'$ and $L^A_{12}{}''$; $L^A_{13}{}'$ and $L^A_{13}{}''$; $L^B_{12}{}'$ and $L^B_{12}{}''$; and $L^B_{13}{}'$ $L^B_{13}{}''$ in FIGS. 5A and 5B). These inductors are realized with short pieces of high-impedance microstrip line. Phase-shift networks PSN47 and PSN48 in FIG. 4 are realized as segments of microstrip transmission line (represented by $TL^A_{12}$ and $TL^B_{12}$).

As for the realization for the various phase-shift networks in FIG. 4, all were implemented as sections of uniform transmission line of 50-ohm nominal characteristic impedance, while maintaining symmetry between the left and the right side of the composite layout. Two of the transmission line segments in the direct signal path, namely $TL^A_{12}$ and $TL^B_{12}$, are of nominal one-quarter-wave length at the tuning band center frequency of 10 GHz. The aggregate electrical length of transmission line segments $TL^A_{31}$ and $TL^B_{31}$ in the first bandpass channel 501, are nominally one half of a wavelength longer at 10 GHz than the aggregate electrical length of the corresponding line segments in channel 502, $TL^A_{21}$ and $TL^B_{21}$. The aggregate absolute line length in each of the two bandpass channels, it should be noted, is arbitrary. It is only the aggregate length differential that counts, due to the fact that the line lengths of the direct-channel 50 ohm transmission line segments, $TL^A_{11}$ and $TL^B_{11}$, can be easily adjusted to provide the phasing necessary to achieve sought-after signal cancellation at the notch frequency. The optimum lengths of the direct-channel transmission line segments, $TL^A_{11}$ and $TL^B_{11}$, are determined not only by the effective total electrical lengths at the notch frequency of the two bandpass channels, but also by the transmission-phase response of the Texas Instruments EG-6345 MMIC amplifier chips, represented by gain blocks $G_2$ and $G_3$ in FIG. 5A. Each of the latter provides approximately 20 dB of gain to meet channel amplification requirements. Each element (or component) shown in FIGS. 5A and 5B has at least two terminals which can serve as the electrical connection points to other elements or the ground.

A number of electrically equivalent options can be used. An alternative configuration that works just as well in both bandpass channels may be implemented, with the proper signal phasing conditions achieved by making either of the main-signal-path line segments, $TL^A{}_{12}$ or $TL^B{}_{12}$, nominally three quarters, rather than one quarter of a wavelength long, and then choosing for the bandpass channels 501 and 502 equal aggregate channel transmission phase shift at the notch center frequency. There are other variations that could be considered, including ones that use more than two frequency-selective channels, just as long as the direct signal path—the one that determines passband performance—does not have to contain active or other noisy and nonlinear circuit elements to maintain forward signal flow in the direct channel.

Bias voltage can be applied to the four varactor diodes $D^A{}_2$, $D^B{}_2$, $D^A{}_3$, and $D^B{}_3$ through cascade connections of three quarter-wavelength-long (at 10 GHz) uniform high-impedance transmission line segments. The physically different, but electrically similar bias networks comprise two high-impedance microstrip lines separated by a low-impedance line. At one end, each bias network is connected to a respective terminal of a varactor diode, and at the voltage supply end, the bias network is provided with a high-frequency short circuit to ground. There are many variations of the bias circuit, including the use of a single quarter-wavelength-long high-impedance line section that yields broader-band performance, which is a preferred embodiment of the invention. Broadband bias networks, in general, constitute a well-known art. Other equivalent bias networks may be used in the notch filter of the present invention. The capacitance of the varactor diodes $D^A{}_2$, $D^B{}_2$, $D^A{}_3$, and $D^B{}_3$ may be varied by varying the bias voltages applied to them.

Figure 6:
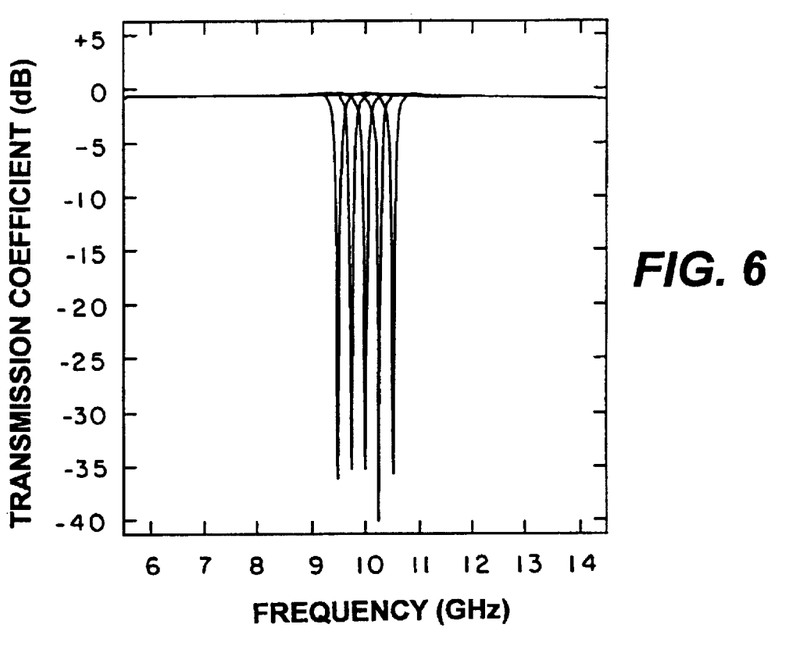
FIG. 6 is a chart illustrating the calculated transmission response of a notch filter according to the present invention for five different varactor bias settings.
Figure 7:
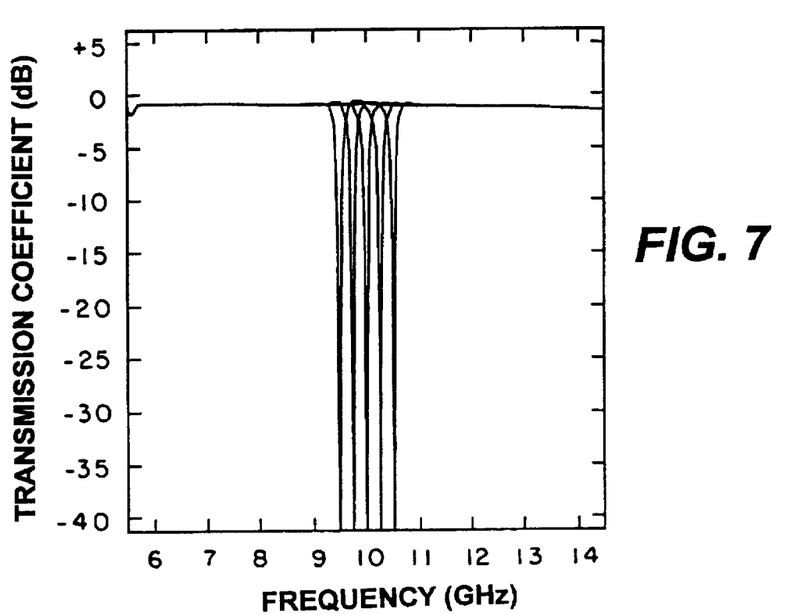
FIG. 7 is a chart illustrating the measured transmission response of the notch filter according to the present invention for the five different varactor bias settings.

The calculated transmission response of the channelized notch filter shown in FIGS. 5A and 5B is given in FIG. 6 for five different settings of monotonically varied varactor bias voltages. The predicted depths of the notches are all in excess of 35 dB, with corresponding notch bandwidths of 70 MHz at the 10-dB-down points. The maximum passband insertion loss is 0.8 dB, and the minimum return loss over the 6-14-GHz passband span is 18 dB. To avoid undue clutter, the experimentally measured transmission responses of the channelized notch filter are plotted separately in FIG. 7. The measured curves are in very close agreement with the calculated curves. In the experimental notch filter based on FIGS. 5A and 5B, it is found that rejection notch depths to greater than 40 dB are possible. It should be noted that the amplifiers' gain controls, once properly adjusted, were left untouched as the notch was tuned in frequency across the band, both in the field-solver-assisted circuit simulations and during experimental testing.

The new filter offers a microwave-active-notch-filter approach that significantly reduces passband noise, when compared to earlier techniques, and virtually eliminates filter-generated passband signal distortion. The filter still possesses all the desirable characteristics of a microwave active filter with regard to combining good frequency selectivity with small size and weight, and low potential cost. In addition, the new filter retains all the desirable attributes of prior-art-channelized active filters, including unconditional circuit stability, modular circuit assemblies composed entirely of 50-ohm referenced building blocks, and high tolerance for passive-element dissipation losses, thereby permitting the use of compact, but lossy lumped circuit elements within the context of a planar microwave-monolithic-integrated-circuit format.

Active notch filters, in the past, have exhibited very high noise figures and high signal distortion levels, even at passband frequencies where no filtering action takes place. This is due to the presence of impedance matching networks in the main signal path that introduce noise, and the presence of active circuit elements in the form of transistors and amplifiers that contribute both noise and signal distortion. The current invention distinguishes itself from such active notch filters by avoiding both lossy impedance-matching elements and all active circuit elements in the passband-determining direct signal path. In addition, as pointed out earlier, the unique resonator configuration employed in each channel filter block requires only a single variable-capacitance element to achieve a signal-rejection notch of invariant notch bandwidth, tunable over a wide center-frequency tuning range. The result is a filter that, for the first time, combines the low-distortion, low-noise qualities of passive notch filters with the performance, size, weight, and cost qualities of active filters.

Variations of the described approach can be used in the notch filter of the present invention. These variations include the use of conventional reciprocal passive directional filters in place of the nonreciprocal frequency-selective branch channels. Alternatives also span all the different, performance-neutral combinations of phase-shift elements that can be used, allowing considerable design latitude. The phase-shift networks themselves need not be confined to sections of uniform transmission line, but can comprise virtually any type of phase-shifting all-pass network, even ones with tunable or switchable elements, if need be. For phase-shifting and bandpass filter networks, the possible use of elements with switchable reactances such as switchable capacitors or switchable inductors, as opposed to continuously variable reactance elements, also applies to the tunable bandpass filters of the invention.

In a third aspect, the present invention relates to a single-pole bandpass filter block that tunes in frequency with the help of only one variable capacitance element, yet still maintains a constant passband width across the tuning span. An important feature of bandpass filter of the present invention is the achievement of a constant notch bandwidth across the entire frequency-tuning span of the notch filter. The solution demonstrated here involves a capacitively end-coupled-resonator configuration, used in the frequency-selective bandpass channels of the new notch filter described earlier, where the resonator is split in half at the electrical symmetry point. This provides optimum impedance-transformation properties that render the channel passband width, and hence the composite filter's notch bandwidth, largely invariant to tuning frequency.

Figure 8:
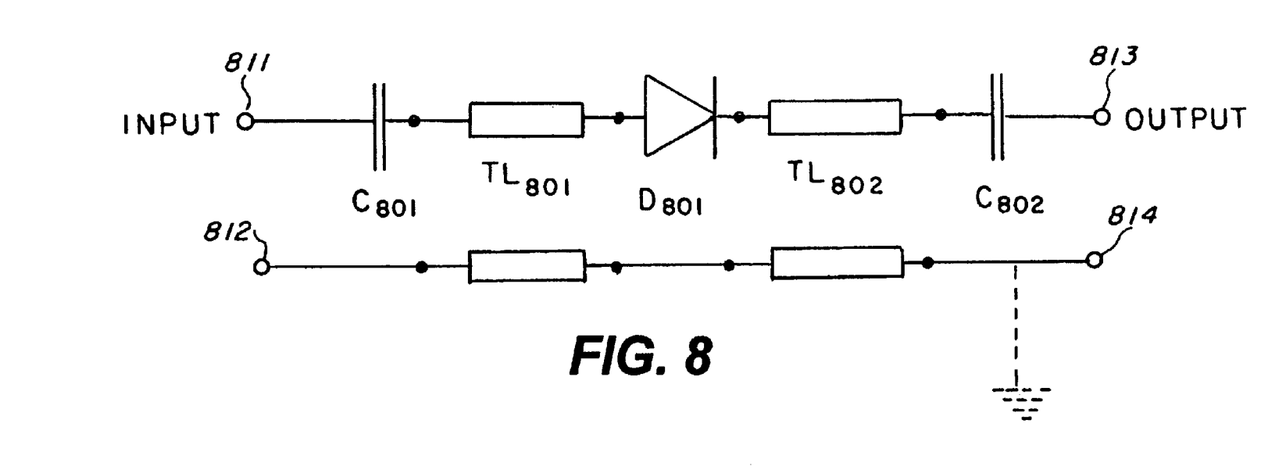
FIG. 8 is a simplified equivalent circuit diagram of an embodiment of a bandpass filter of the present invention.

FIG. 8 shows one embodiment of the single-pole bandpass filter of the present invention. The single-pole bandpass filter shown in FIG. 8 includes an input port which further includes two terminals 811 and 812, a series capacitor C801, an inductive element TL801, a variable reactance element D801, an inductive element TL802, a series capacitor C802, and an output port which further includes two terminals 813 and 814. Preferably, the inductive elements TL801 and TL802 can be high-impedance transmission-line segments described above. The transmission-line segments include four terminals as shown in FIG. 8 with first terminals 815 and 819, second terminals 817 and 821, third terminals 816 and 820, and fourth terminals 818 and 822. Optionally, the inductive elements TL801 and TL802 can be inductors. The input port consisting of terminals 811 and 812, series capacitor C801, inductive element TL801, variable reactance element D801, inductive element TL802, series capacitor C802, and the output port consisting of terminals 813 and 814 are connected sequentially in cascade. Preferably, inductive elements TL801 and TL802 are planar gold microstrip structures on 0.010-inch-thick alumina with gold ground plane. Preferably, terminal 812 and terminal 814 are grounded.

Figure 9:
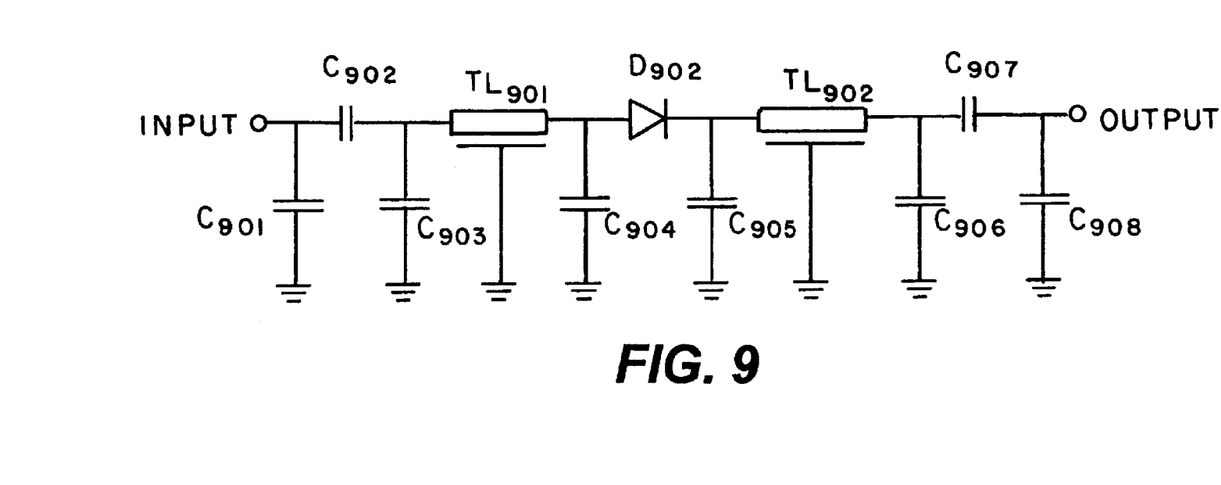
FIG. 9 is a simplified equivalent circuit diagram of another embodiment of a bandpass filter of the present invention.

FIG. 9 shows a preferred embodiment of the single-pole bandpass filter of the present invention. The circuit of FIG. 9 may also represent one of the single-pole bandpass filters of FIG. 4 (BPF41, BPF42, BPF43 and BPF44). The single-pole bandpass filter of the invention is realized as a pair of inductive, high-impedance uniform transmission-line segments of equal electrical length (represented by transmission line segments TL901 which has its grounding plane grounded and TL902 which has its grounding plane grounded in FIG. 9), with transmission-line segments within the pair linked through a series-connected commercial MA-46604 abrupt-junction semiconductor tuning varactor diode in chip form (represented by element D902), and cascade-connected at the other (outside) ends of transmission line-segments to interdigitated series coupling capacitors which are augmented by shunt capacitors to ground. The shunt capacitors represent, in part, shunt capacitance added deliberately for impedance-transformation purposes. The added shunt capacitance is realized in the circuit by enlarging the terminal pad areas of the microstrip interdigitated series capacitors. Where the bandpass filters connect to the direct signal path of a notch filter at respective three-port junctions, pertinent shunt capacitors are shared between the respective bandpass filter section and its junction network. Each series-shunt-capacitor combination is represented in the equivalent circuit of FIG. 9 by a group of three capacitors (represented by C901, C902, and C903; C906; C907, and C908 in FIG. 9). The remaining shunt capacitors in FIG. 9, namely those connected at the diode terminals, describe the capacitance to ground of the diode-chip mounting pads (represented by capacitors C904 and C905). The bandpass filter of the present invention further includes an input and an output port as shown in FIG. 9. The input port includes two terminals 911 and 912. The output port includes two terminals 913 and 914. Terminals 912 and 914 are grounded. Each element shown in FIG. 9 has at least two terminals which can serves as the electrical connection points to other elements or the ground. Optionally, all those grounding connections in this embodiment can all be connected to a same filter bus (a conductive line) instead of all being grounded. The filter bus may or may not be grounded. Therefore, all the terminals of both the input and the output ports may be floating terminals.

The foregoing detailed description of the invention and examples are not intended to limit the scope of the invention in any way. The scope of the invention is to be determined from the claims appended hereto.

What is claimed is:

1. A notch filter comprising:
    a reciprocal passive phase-shift network having a first port and a second port,
    a frequency-selective directional coupling network having a third port, a fourth port, a fifth port, and a sixth port,
    the third port of the frequency-selective coupling network being receptive to an input signal,
    the fourth port of the frequency-selective coupling network being capable of producing an output signal,
    the fifth port of the frequency-selective coupling network being connected to the first port of the reciprocal passive phase-shift network,
    the sixth port of the frequency-selective coupling network being connected to the second port of the reciprocal passive phase-shift network,
    the frequency-selective directional coupling network allowing essentially no signal to flow from the third port of the frequency-selective directional coupling network to the sixth port of the frequency-selective directional coupling network through the frequency-selective directional coupling network,
    wherein upon receiving a first input signal having a frequency within a predetermined frequency band, a first portion of the first input signal passes from the third port of the frequency-selective directional coupling network to the fifth port of the frequency-selective directional coupling network, from the fifth port of the frequency-selective directional coupling network to the sixth port of the frequency-selective directional coupling network through the reciprocal passive phase-shift network, and from the sixth port of the frequency-selective directional coupling network to the fourth port of the frequency-selective directional coupling network; and
    a second portion of the first input signal passes from the third port of the frequency-selective directional coupling network to the fourth port of the frequency-selective directional coupling network through the frequency-selective directional coupling network, resulting in cancellation of the first portion of the first input signal with the second portion of the first input signal at the fourth port of the frequency-selective directional coupling network, and
    wherein upon receiving a second input signal having a frequency outside the predetermined frequency band, essentially all of the second input signal passes from the third port to the fifth port, from the fifth port to the sixth port through the reciprocal passive phase-shift network, and from the sixth port to the fourth port.

2. A channelized notch filter as claimed in claim 1, wherein the frequency-selective directional coupling network is nonreciprocal.

3. A channelized notch filter as claimed in claim 1, wherein the frequency-selective directional coupling network is active.

4. A channelized notch filter comprising:
    a main input port;
    a main output port;
    a first branch channel;
    a second branch channel;
    a third branch channel;
    the first branch channel comprising a first input port, a first bandpass filter, a first phase-shift network, a second bandpass filter, and a first output port electrically connected sequentially in cascade,
    the second branch channel comprising a second input port, a third bandpass filter, and a second output port electrically connected sequentially in cascade,
    the third branch channel comprising a third input port, a second phase-shift network and a third output port electrically connected sequentially in cascade, wherein the main input port, the first input port, the second input port and the third input port are electrically connected; and a third phase-shift network having a fourth input port and a fourth output port, wherein the first output port of the first branch channel is electrically connected to the main output port and to the fourth output port of the third phase-shift network, and wherein the second output port of the second branch channel is electrically connected to the fourth input port of the third phase-shift network and to the third output port of the third branch channel.

5. A channelized notch filter as claimed in claim 4, wherein the first and second branch channels are electrically equivalent without taking into account the first phase-shift network.

6. A channelized notch filter as claimed in claim 4, wherein the first bandpass filter, the first phase-shift network, the second bandpass filter, the third bandpass filter, the second phase-shift network and the third phase-shift network comprise primarily a material selected from the group consisting of a substantially superconductive material and a highly conductive material.

7. A channelized notch filter as claimed in claim 4, wherein the first branch channel, the second branch channel, and the third phase-shift network together form a frequency-selective directional coupling network.

8. A channelized notch filter comprising:
   a main input port;
   a main output port;
   a first branch channel;
   a second branch channel;
   a third branch channel,
   the first branch channel comprising a first input port, a first bandpass filter, a first phase-shift network, an amplifier, a second phase-shift network, a second bandpass filter, and a first output port electrically connected in cascade,
   the second branch channel comprising a second input port, a third bandpass filter, a third phase-shift network, an amplifier, a fourth phase-shift network, a fourth bandpass filter, and a second output port electrically connected in cascade,
   the third branch channel comprising a third input port, a fifth phase-shift network, and a third output port electrically connected in cascade;
   a sixth phase-shift network;
   a seventh phase-shift network;
   a first three-port compensated junction network connecting the main input port, the first input port of the first branch channel, and the sixth phase-shift network;
   a second three-port compensated junction network connecting the sixth phase-shift network, the second input port of the second branch channel, and the third input port of the third branch channel;
   a third three-port compensated junction network connecting the main output port, the first output port of the first branch channel, and the seventh phase-shift network; and
   a fourth three-port compensated junction network connecting the seventh phase-shift network, the second output port of the second branch channel, and the third output port of the third branch channel,
   wherein the first and second branch channels, the sixth and seventh phase-shift networks, and the first, second, third and fourth compensated junction networks together form a frequency-selective directional four-port coupling network,
   whereby upon receiving a first signal having a frequency with a predetermined frequency band, the coupling network directs a first portion of the first input signal through the first and second branch channels that are a part of the selective directional four-port coupling network and a second portion of the first input signal to the third branch channel, causing the second portion of the first input signal passing through the third branch channel to cancel the first portion of the first input signal passing through the first and second branch channels, and
   whereby upon receiving a second signal having a frequency outside the predetermined frequency band, the frequency-selective directional four-port coupling network directs essentially all of the second signal through the third branch channel.

9. A channelized notch filter as claimed in claim 8, wherein at least one of the bandpass filters comprises a single capacitive-end-coupled resonator microstrip structure on a suitable substrate.

10. A channelized notch filter as claimed in claim 8, wherein at least one of the bandpass filters comprises:
    an input port having a first input terminal and a second input terminal;
    a first series capacitor;
    a first inductive, short transmission-line element;
    a variable series reactance element;
    a second inductive, short transmission-line element;
    a second series capacitor; and
    an output port having a first output terminal and a second output terminal,
    wherein the input port, the first series capacitor, the first inductive short transmission-line element, the series variable reactance element, the second inductive short transmission-line element, the second series capacitor, and the output port are all electrically connected sequentially in cascade, and
    wherein the second input terminal of the input port, and the second output terminal of the output port are electrically connected to ground.

11. A channelized notch filter as claimed in claim 8, wherein at least one of the bandpass filters comprises:
    an input port having a first terminal and a second terminal;
    an output port having a first terminal and a second terminal, wherein the second terminal of the input port and the second terminal of the output port are grounded;
    a first capacitor having a first terminal and a second terminal, wherein the first terminal of the first capacitor is electrically connected with the first terminal of the input port and the second terminal of the first capacitor is grounded;
    a second capacitor having a first terminal and a second terminal, wherein the first terminal of the second capacitor is electrically connected to the first terminal of the input port;
    a third capacitor having a first terminal and a second terminal, wherein the first terminal of the third capacitor is electrically connected to the second terminal of the second capacitor and the second terminal of the third capacitor is grounded;

a first transmission-line segment having a first terminal, a second terminal, a third terminal and a fourth terminal, wherein the first terminal of the first transmission-line segment is electrically connected to the second terminal of the second capacitor, and wherein the third and fourth terminals of the first transmission-line segment are grounded;

a fourth capacitor having a first terminal and a second terminal, wherein the first terminal of the fourth capacitor is electrically connected to the second terminal of the first transmission line segment, and wherein the second terminal of the fourth capacitor is grounded;

a variable-reactance element having a first terminal and a second terminal, wherein the first terminal of the variable-reactance element is electrically connected to the second terminal of the first transmission-line segment;

a fifth capacitor having a first terminal and a second terminal, wherein the first terminal of the fifth capacitor is electrically connected to the second terminal of the variable reactance element and the second terminal of the fifth capacitor is grounded;

a second transmission-line segment having a first terminal, a second terminal, a third terminal and a fourth terminal, wherein the first terminal of the second transmission-line segment is electrically connected to the second terminal of variable-reactance element, and wherein the third and fourth terminals of the second transmission-line segment are grounded;

a sixth capacitor having a first terminal and a second terminal, wherein the first terminal of the sixth capacitor is electrically connected to the second terminal of the second transmission-line segment and the second terminal of the sixth capacitor is grounded;

a seventh capacitor having a first terminal and a second terminal, wherein the first terminal of the seventh capacitor is electrically connected to the second terminal of the second transmission-line segment and the second terminal of the seventh capacitor is electrically connected to the first terminal of the output port; and an eighth capacitor having a first terminal and a second terminal, wherein the first terminal of the eighth capacitor is electrically connected to the second terminal of the seventh capacitor and the first terminal of the output port and the second terminal of the eighth capacitor is grounded.

12. A channelized notch filter as claimed in claim 11, wherein the variable-reactance element is a semiconductor varactor.

13. A channelized notch filter as claimed in claim 8, wherein the compensated junction network comprises a microstrip T-section and segments of high-impedance transmission line.

14. A channelized notch filter as claimed in claim 8, wherein the first, second, third, fourth, fifth, sixth and seventh phase-shift networks are implemented as sections of uniform transmission line.

15. A channelized notch filter as claimed in claim 8, wherein the sixth and seventh phase-shift networks comprise one-quarter-wavelength segments of transmission line.

16. A single-pole bandpass filter comprising:

an input port having a first terminal and a second terminal;

an output port having a first terminal and a second terminal, wherein the second terminal of the input port and the second terminal of the output port are grounded;

a first capacitor having a first terminal and a second terminal, wherein the first terminal of the first capacitor is electrically connected with the first terminal of the input port and the second terminal of the first capacitor is grounded;

a second capacitor having a first terminal and a second terminal, wherein the first terminal of the second capacitor is electrically connected to the first terminal of the input port;

a third capacitor having a first terminal and a second terminal, wherein the first terminal of the third capacitor is electrically connected to the second terminal of the second capacitor and the second terminal of the third capacitor is grounded;

a first transmission-line segment having a first terminal, a second terminal, a third terminal, and a fourth terminal, wherein the first terminal of the first transmission-line segment is electrically connected to the second terminal of the second capacitor, and wherein the third and fourth terminals of the first transmission-line segment is grounded;

a fourth capacitor having a first terminal and a second terminal, wherein the first terminal of the fourth capacitor is electrically connected to the second terminal of the first transmission line segment, and wherein the second terminal of the fourth capacitor is grounded;

a variable-reactance element having a first terminal and a second terminal, wherein the first terminal of the variable-reactance element is electrically connected to the second terminal of the first transmission-line segment;

a fifth capacitor having a first terminal and a second terminal, wherein the first terminal of the fifth capacitor is electrically connected to the second terminal of the variable-reactance element and the second terminal of the fifth capacitor is grounded;

a second transmission-line segment having a first terminal, a second terminal, a third terminal and a fourth terminal, wherein the first terminal of the second transmission-line segment is electrically connected to the second terminal of variable-reactance element, and wherein the third and fourth terminals of the second transmission-line segment are grounded;

a sixth capacitor having a first terminal and a second terminal, wherein the first terminal of the sixth capacitor is electrically connected to the second terminal of the second transmission-line segment and the second terminal of the sixth capacitor is grounded;

a seventh capacitor having a first terminal and a second terminal, wherein the first terminal of the seventh capacitor is electrically connected to the second terminal of the second transmission-line segment and the second terminal of the seventh capacitor is electrically connected to the first terminal of the output port; and an eighth capacitor having a first terminal and a second terminal, wherein the first terminal of the eighth capacitor is electrically connected to the second terminal of the seventh capacitor and the first terminal of the output port and the second terminal of the eighth capacitor is grounded.

17. A single-pole bandpass filter as claimed in claim 16, wherein the variable-reactance element is a voltage-tunable varactor diode.

18. A single-pole bandpass filter as claimed in claim 16, wherein the variable-reactance element is an element with a switchable reactance.

* * * * *